(12) United States Patent
Wu et al.

(10) Patent No.: US 8,659,365 B2
(45) Date of Patent: Feb. 25, 2014

(54) COMMON MODE NOISE SUPPRESSION CIRCUIT

(75) Inventors: Tzong-Lin Wu, Taipei (TW); Chung-Hao Tsai, Taipei (TW); Iat In Ao Ieong, Taipei (TW)

(73) Assignee: National Taiwan University, Taipei (TW)

( * ) Notice: Subject to any disclaimer, the term of this patent is extended or adjusted under 35 U.S.C. 154(b) by 582 days.

(21) Appl. No.: 12/898,987

(22) Filed: Oct. 6, 2010

(65) Prior Publication Data

US 2012/0025925 A1  Feb. 2, 2012

(30) Foreign Application Priority Data

Jul. 30, 2010 (TW) .................................. 99125272

(51) Int. Cl.
*H04B 3/30* (2006.01)
*H03H 7/01* (2006.01)

(52) U.S. Cl.
USPC .......................................... 333/12; 333/185

(58) Field of Classification Search
USPC .............................. 333/4, 5, 12, 175, 181, 185
See application file for complete search history.

(56) References Cited

U.S. PATENT DOCUMENTS

| | | | | |
|---|---|---|---|---|
| 5,319,535 A * | 6/1994 | Brennen | | 363/40 |
| 5,357,227 A * | 10/1994 | Tonegawa et al. | | 333/185 |
| 7,652,476 B2 * | 1/2010 | de Rooij et al. | | 324/322 |
| 7,956,704 B1 * | 6/2011 | Acimovic | | 333/181 |
| 8,044,746 B2 * | 10/2011 | Blair et al. | | 333/5 |
| 2005/0063127 A1 * | 3/2005 | Anthony | | 361/118 |
| 2008/0186106 A1 * | 8/2008 | Christian et al. | | 333/133 |
| 2009/0003191 A1 * | 1/2009 | Inuzuka et al. | | 369/283 |
| 2010/0188169 A1 * | 7/2010 | Hossain et al. | | 333/175 |
| 2011/0025434 A1 * | 2/2011 | Hsieh et al. | | 333/204 |

OTHER PUBLICATIONS

Mutual Inductance; http://www.electronics-tutorials.ws.; Oct. 11, 2009.*

* cited by examiner

*Primary Examiner* — Benny Lee
*Assistant Examiner* — Rakesh Patel
(74) *Attorney, Agent, or Firm* — Edwards Wildman Palmer LLP; Peter F. Corless; Steven M. Jensen

(57) ABSTRACT

A common mode noise suppression circuit applicable to differential signal transmission performs common mode noise suppression with respect to differential signals transmitted by a transmission line. An inductance-capacitance resonant structure is formed based on electromagnetic coupling combining a ground structure to suppress common mode noise of differential mode signals at broadband meanwhile keeping low loss of the differential mode signals at broadband via differential transmission lines. By this, the common mode noise suppression circuit performs broadband suppression with related to the common mode noise within a frequency scope of several GHz without affecting the differential mode signals and improves manufacturing process miniaturization to decrease cost.

17 Claims, 11 Drawing Sheets

COMMON MODE NOISE SUPPRESSION CIRCUIT

CROSS-REFERENCES TO RELATED APPLICATIONS

This application claims under 35 U.S.C. §119(a) the benefit of Taiwanese Application No. 099125272 filed Jul. 30, 2010, the entire contents of which is incorporated herein by reference

BACKGROUND OF THE INVENTION

1. Field of the Invention

This invention relates to common mode noise filters, and more particularly, to a common mode noise suppression circuit applicable to perform broadband suppression with related to a common mode noise within a frequency scope of several GHz.

2. Description of Related Art

Since more and more complex electromagnetic environment in an electronic system, electromagnetic interference (EMI) phenomenon is much worse and becomes an obvious obstacle affecting regular operation of the system. Since rapid development of high speed digital circuits, data rate transmission is constantly increasing and researchers are driven to pay attention to suppress noise and crosstalk of digital system. Ideally, a differential signal may maintain well original signal aspect and maintain low electromagnetic radiation or electromagnetic interference. However, in an actual circuit, unbalanced delay and amplitude, or unbalanced design of input/output register or package layout may cause the differential signal to generate different rising/falling edge time such that unwanted common mode noise attaches the differential signal. With respect to high speed data transmission interface, for instance, Serial ATA, PCI-E, OC-192, Gigabit Ethernet, etc., a cable is always needed to transmit the differential signals between different electronic devices. At this time, a common mode noise may be coupled to an input/output cable and is formed to be an excitation source such that the input/output cable becomes an EMI antenna. Hence, in order to solve electromagnetic interference problem of the input/output cable, it should suppress common mode noise on a differential signal route so as not to affect quality of the differential signal.

With regards to this, some methods for suppressing common mode noise of differential signals are provided, wherein a common mode choke is the most typical one. The common mode choke consists of two independent coils with the same amount of wire loops winding the same magnet, wherein its structure equals to a winding or feed through core coil, and it may generate high conductive impedance for common mode noise and generate impedance approaching to zero for differential signal via high magnetic conductivity needle by summation and subtraction of self inductance and mutual inductance. However, the common mode choke works only with MHz scope, the common mode choke is not easily designed to be applied above high frequency section of GHz because of frequency characteristic and parasitics of ferromagnetic material, and manufacturing process and complex structure of the common mode choke is not suitable to modern miniaturized circuits. Furthermore, there provides a small common mode suppression filter which could work within MHz scope according to magnetic flux elimination principle and adopts Low Temperature Co-fired Ceramic (LTCC) technology. Additionally, there also provides some common mode suppression filters using pattern ground structure to eliminate common mode noise, wherein it may have broadband common mode suppression effect within GHz scope and have low cost. However, dimension of the pattern ground structure is half or quarter of wavelength of transmission signal, it would occupy large ground area of the circuit board such that area of made common mode filter fails to be reduced.

Therefore, it is imperative to how to provide a common mode noise suppression circuit which may solve various disadvantage of prior arts for improving shortcomings of prior arts having too high area and bad operation performance at high frequency.

SUMMARY OF THE INVENTION

In view of the above-mentioned problems of the prior art, it is a primary objective of the present invention to provide a common mode noise suppression mechanism applicable to high speed or high frequency digital differential signals.

To achieve the above-mentioned and other objectives, the invention provides a common mode noise suppression circuit for suppressing a common mode noise of a differential signal, comprising: a reference potential structure formed from a conductor; a differential transmission structure disposed to form an electromagnetic coupling with the reference potential structure, wherein the differential transmission structure has a pair of transmission conductors for transmitting the differential signal, and the two transmission conductors respectively form the electromagnetic coupling with the reference potential structure so as to form a transmission line characteristic to prevent differential mode transmission from being affected when transmitting the differential signal; a ground layer electrically connected to a ground potential; and a ground structure electrically connected to the reference potential structure and the ground layer for forming an inductance-capacitance resonant structure together with the electromagnetic coupling formed by the reference potential structure and the differential transmission structure, and an inductance formed by the ground structure itself, so as to suppress a common mode signal at a specific frequency.

Moreover, the invention further provides another common mode noise suppression circuit applicable to suppress a common mode noise when transmitting a differential signal, comprising: a reference potential structure formed from a conductor; a differential transmission structure forming an electromagnetic coupling with the reference potential structure, wherein the differential transmission structure has a pair of transmission conductors for transmitting the differential signal, and the two transmission conductors respectively form the electromagnetic coupling with the reference potential structure to form a transmission line characteristic when transmitting the differential signal; a ground layer electrically connected to a ground potential; and a ground structure electrically connected to the reference potential structure and the ground layer for forming an inductance-capacitance resonant structure together with the electromagnetic coupling formed by the reference potential structure and the differential transmission structure, and an inductance formed by the ground structure itself; wherein the inductance-capacitance resonant structure provides a serial resonance at a first specific frequency and forms a low impedance with related to the common mode signal such that the common mode signal is guided to the ground potential to form a first zero at the first specific frequency; wherein the inductance-capacitance resonant structure provides a parallel resonance at a second specific frequency and forms a high impedance with respect to a common mode signal such that the common mode signal is guided to an original route and cannot be transmitted, and forms a second zero at the second specific frequency.

In an aspect of the invention, the ground structure is electrically connected to the reference potential structure at a midline location of the transmission conductors.

In another aspect of the invention, a coupling capacitance and a coupling inductance respectively are formed between the reference potential structure and the two transmission conductors, and the inductance formed by the ground structure is formed between the reference potential structure and the ground layer.

In further aspect of the invention, an electromagnetic coupling or transmission line characteristic formed by the two transmission conductors and the reference potential structure combines with the ground structure to form an inductance characteristic, such that the common mode noise suppression circuit forms corresponding zeros at one or more specific frequencies.

In further aspect of the invention, the transmission line characteristic formed by the two transmission conductors and the reference potential structure prevents attenuation and loss of the differential signal when transmitting the differential signal, thereby assuring the transmission of the differential signal.

In further aspect of the invention, a dielectric material or a ferromagnetic/ferrimagnetic material layer is further disposed between the reference potential structure and the differential transmission structure to regulate values of the coupling capacitance or the coupling inductance.

In further aspect of the invention, a ferromagnetic/ferrimagnetic material layer disposed is further between the reference potential structure and the ground layer to regulate inductance values formed by the ground structure.

In further aspect of the invention, the two transmission conductors are disposed to be parallel or symmetric to each other.

Compared with the prior art, the common mode noise suppression circuit of the present invention forms an inductance-capacitance resonant structure based on electromagnetic coupling theorem combining a ground structure to suppress common mode noise of high speed differential mode signals at broadband meanwhile keeping low loss of the differential mode signals at broadband via differential transmission lines. That is, on the one hand, the inductance-capacitance resonant structure provides a serial resonance and forms a low impedance with related to the common mode signal such that the common mode signal is guided to the ground potential. On the other hand, the inductance-capacitance resonant structure provides a parallel resonance and forms a high impedance with related to the common mode signal such that the common mode signal is guided to an original route meanwhile not affecting differential mode signal transmission on the transmission conductor (transmission line). Compared with common mode noise suppression technique of prior arts, the common mode noise suppression circuit of the present invention achieves miniaturization effect and performs broadband suppression with related to the common mode noise within a frequency scope of several GHz without affecting the differential mode signals. Additionally, the common mode noise suppression circuit of the present invention may also be performed on a circuit board to achieve higher cost benefit.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
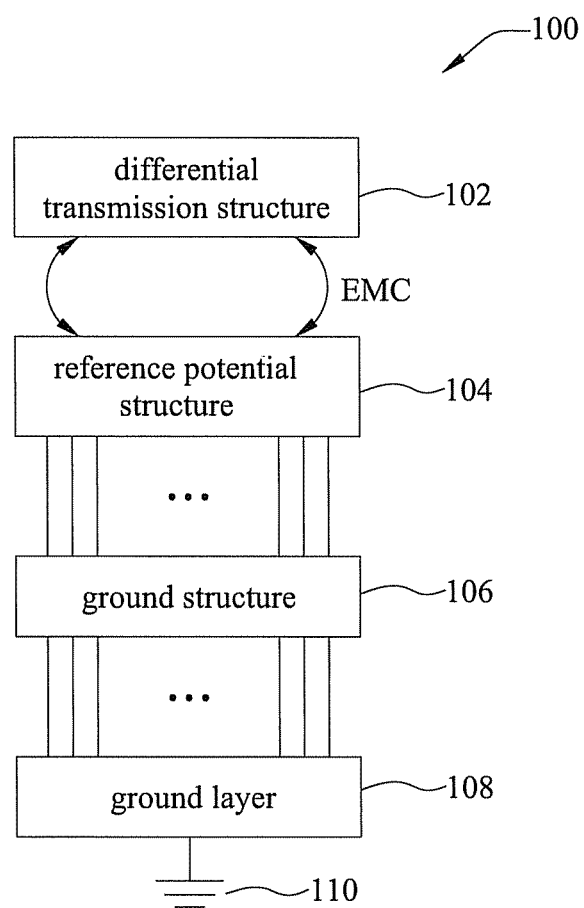
FIG. 1 illustrates an architecture diagram of a common mode noise suppression circuit in accordance with the present invention.

Please refer to FIG. 1 showing a schematic diagram of a common mode noise suppression circuit 100 of the present invention. As illustrated, the common mode noise suppression circuit 100 comprises a differential transmission structure 102, a reference potential structure 104, a ground structure 106 and a ground layer 108.

Electromagnetic coupling (EMC) is formed between the differential transmission structure 102 and the reference potential structure 104 to generate coupling capacitance and coupling inductance between both while to generate mutual induction and mutual capacitance between transmission conductors of the differential transmission structure 102. For example, the differential transmission structure 102 may comprise a pair of parallel and/or symmetric transmission conductors or differential transmission lines, wherein the two transmission conductors or the transmission lines form electromagnetic coupling with respect to the reference potential structure 104. Hence there are coupling capacitance and coupling inductance between the reference potential structure 104 and the two transmission conductors or the transmission lines while these transmission conductors or the transmission lines generate mutual induction and mutual capacitance between both.

The reference potential structure 104 may comprise a main body in any shape formed from conductors. For instance, the reference potential structure 104 may be a surface being flat, arc-shaped or corrugated which is received of acceptable to form electromagnetic coupling with respect to the differential transmission structure 102.

The ground structure 106 is electrically connected to the reference potential structure 104 and the ground layer 108 respectively and forms inductance between the reference potential structure 104 and the ground layer 108. Additionally, inductance formed by the ground structure 106 may form an inductance-capacitance resonant structure together with the coupling capacitance and the coupling inductance generated by the electromagnetic coupling between the differential transmission structure 102 and the reference potential structure 104 previously described.

The ground layer 108 is electrically connected to a ground potential 110.

As previous description, the inductance-capacitance resonant structure of the common mode noise suppression circuit 100 of the present invention may generate a serial resonance at a first specific frequency and form a low impedance zero (Zero) with related to a common mode signal such that the common mode signal is guided to the ground potential 110. Alternatively, the inductance-capacitance resonant structure may also generate a parallel resonance at a second specific frequency and form high impedance with related to the common mode signal such that the common mode signal is reflected to an original route thereby generating a response similar to the Zero so as to achieve common mode signal suppression effect.

It should be explained that the first specific frequency and the second specific frequency may be the same or different according to dimensions and characteristic of each component of the common mode noise suppression circuit 100.

Figure 2A:
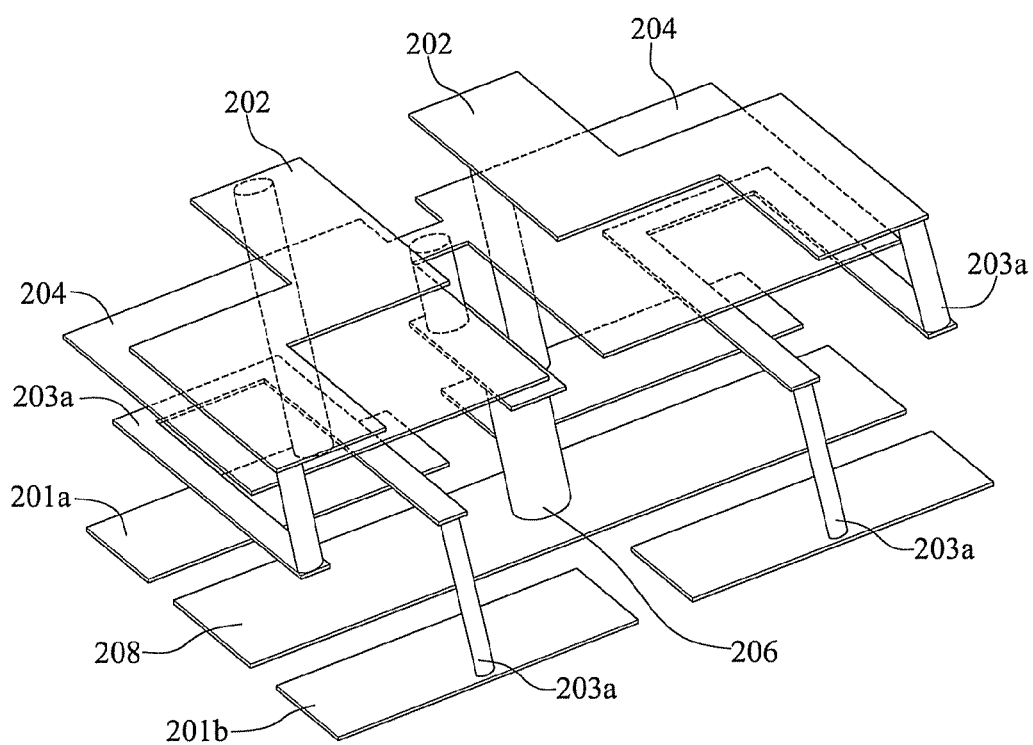
FIG. 2A illustrates a schematically stereo diagram of the common mode noise suppression circuit in accordance with the present invention.
Figure 2B:
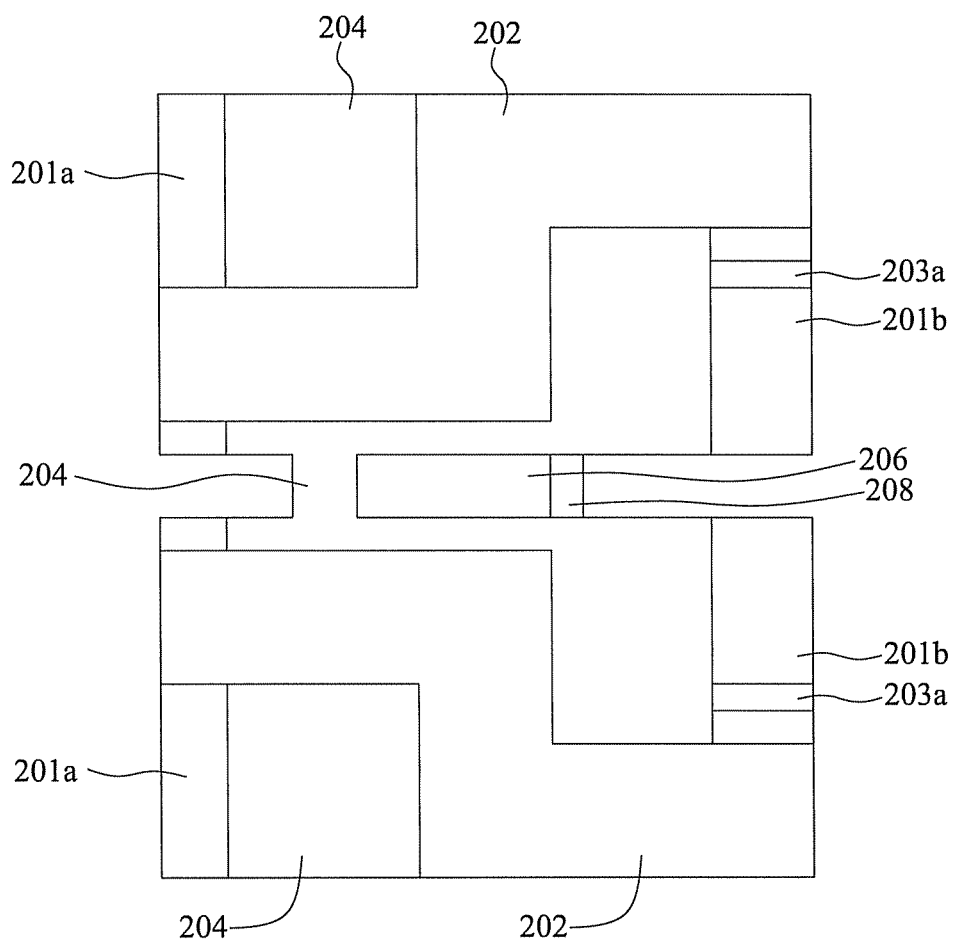
FIG. 2B illustrates a top view diagram of the common mode noise suppression circuit in accordance with the present invention.
Figure 2C:
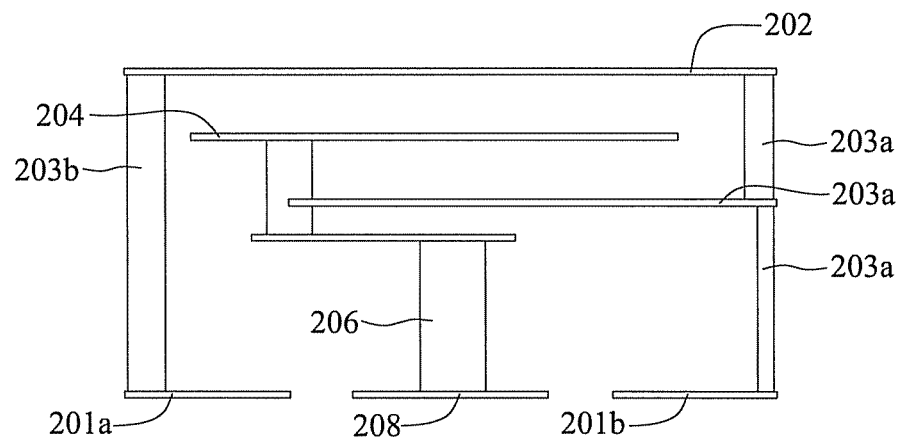
FIG. 2C illustrates a side view diagram of the common mode noise suppression circuit in accordance with the present invention.

Please refer to FIGS. 2A-2C simultaneously, wherein FIG. 2A illustrates a schematically stereo diagram of the common mode noise suppression circuit of the present invention, FIG. 2B illustrates a top view diagram of the common mode noise suppression circuit of the present invention, and FIG. 2C illustrates a side view diagram of the common mode noise suppression circuit of the present invention. As illustrated in FIG. 2A, the common mode noise suppression circuit comprises a differential transmission conductor 202, a reference potential structure 204, a ground structure 206 and a ground layer 208. These differential transmission conductors 202 may be connected to a differential signal input terminal 201a and a differential signal output terminal 201b via conductive vias 203a, 203b like a blind via structure.

The reference potential structure 204 is formed from conductors and in the embodiment is, not limit to, a plate structure. While in another embodiment it may be in any shape.

In the embodiment, these differential transmission conductors 202 are disposed to be partially parallel to the reference potential structure 204, symmetric to each other, used for transmitting differential signals, space at the same distance with the reference potential structure 204, and respectively form electromagnetic coupling with the reference potential structure 204 (It will be explained later). When transmitting the differential signals, two transmission conductors 202 generate electromagnetic coupling respectively with the reference potential structure 204 and mutual induction and mutual capacitance with each other thereby forming a transmission line characteristic so as to transmit the differential signals under transmission condition of very low attenuation and loss.

The ground layer 208 is electrically connected to a ground potential (GND) and the ground structure 206.

In the embodiment, the ground structure 206 is electrically connected to the reference potential structure 204 at a midline location of the two differential transmission conductors 202. Inductance formed by the ground structure 206 may form an inductance-capacitance resonant structure in corporation with the coupling capacitance and the coupling inductance generated by the electromagnetic coupling between these differential transmission conductors 202 and the reference potential structure 204.

It may change values of each capacitance or inductance element in an equivalent circuit by regulating width of these differential transmission conductors 202 and distance between them and width and length of reference potential structure according to demand of a designer. The inductance-capacitance resonant structure may form a low impedance zero with related to a common mode signal at some specific frequencies such that the common mode signal is guided to the ground potential, furthermore, may form high impedance with related to the common mode signal such that the common mode signal is reflected to an original route thereby generating an effect similar to the zero.

As previous description, the common mode noise suppression circuit of the present invention suppresses common mode noise (signals) while not affecting differential signal transmission. It should be explained that the common mode noise suppression circuit shown in FIG. 2A only illustrates an architecture in unit length, that is, this architecture may also be applicable to a combination of plural similar architectures.

In another embodiment, the two differential transmission conductors 202 may be symmetric conductive lines or metal interconnections, the reference potential structure 204 may be a combination of a multi-layered plate, a circular surface or a corrugated surface, and additionally the ground structure 206 may also be achieved via a more complex conductor structure in combination with a conductive via. Other modifications or implementation aspects of the previously described transmission conductor, reference potential structure and ground structure will be described in the following description.

Figure 3A:
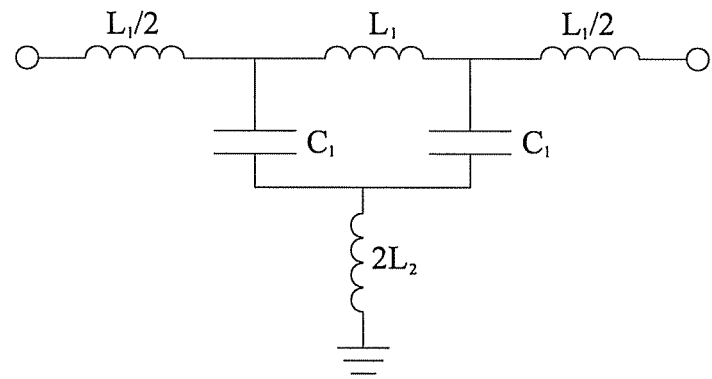
FIG. 3A illustrates a schematic diagram of a double-zero even mode equivalent circuit of the common mode noise suppression circuit in accordance with the present invention.

Please refer to FIG. 3A illustrating a schematic diagram of a double-zero even mode equivalent circuit of the common mode noise suppression circuit shown in FIG. 2A. As illustrated, this double-zero even mode equivalent circuit is an equivalent circuit with two degrees, wherein the inductance $L_1$ is a coupling inductance generated between the transmission conductor and the reference potential structure, the coupling capacitance $C_1$ is a coupling capacitance generated between the transmission conductor and the reference potential structure, and the inductance $2L_2$ is an even mode equivalent inductance between the reference potential structure and the ground layer generated by the ground structure.

The inductance $2L_2$ is a lower circuit while others, except the inductance $2L_2$, is an upper circuit. The upper circuit and lower circuit are used for conveniently explaining relative locations of the technical feature of the present invention and not a restriction of implementation aspects of the present invention. In order to find a zero of this circuit, it may first find its transmission impedance $Z_{21}$. Since this circuit may be a cascode of the upper and the lower, there is:

$$\begin{bmatrix} V_1 \\ V_2 \end{bmatrix} = \begin{bmatrix} V_1^a + V_1^b \\ V_2^a + V_2^b \end{bmatrix} = \begin{bmatrix} Z_{11}^a + Z_{11}^b & Z_{12}^a + Z_{12}^b \\ Z_{21}^a + Z_{21}^b & Z_{22}^a + Z_{22}^b \end{bmatrix} \begin{bmatrix} i_1 \\ i_2 \end{bmatrix}$$

$$Z_{total} = Z_a + Z_b,$$

That is, its Z matrix is a summation of its upper Z matrix and Lower Z matrix. Hence, $Z_{21}$ of this circuit is a summation of $Z_{21}$ of the upper circuit and $Z_{21}$ of the lower circuit. Solving eigenvalues of "$Z_{21}=0$" may find the zero of the circuit. For the upper circuit, $$Z_{21\_up} = \frac{1}{2j\omega C_1 - j\omega^3 L_1 C_1^2}.$$

For the lower circuit, $Z_{21\_down} = 2j\omega L_2$.

Let $Z_{21} = Z_{21\_up} + Z_{21\_down} = 0$ and then obtain, $$\omega_{z1,z2} = \sqrt{\frac{1 \pm \sqrt{1 - L_1/2L_2}}{L_1 C_1}} \quad (1)$$

Generally, it may design $L_2 > L_1$ such that $$\omega_{z1} \cong \frac{1}{\sqrt{2L_2 2C_1}}, \omega_{z2} \cong \frac{1}{\sqrt{L_1 C_1/2}} \quad (2)$$

Figure 3B:
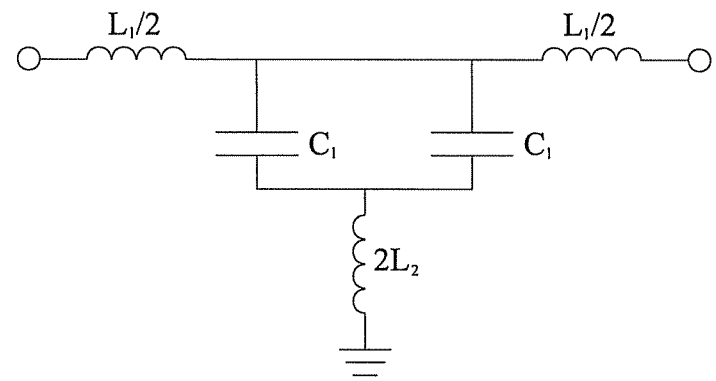
FIG. 3B illustrates a schematic diagram of an even mode equivalent circuit of an inductance-capacitance resonant structure of the common mode noise suppression circuit occurring serial resonance in accordance with the present invention.
Figure 3C:
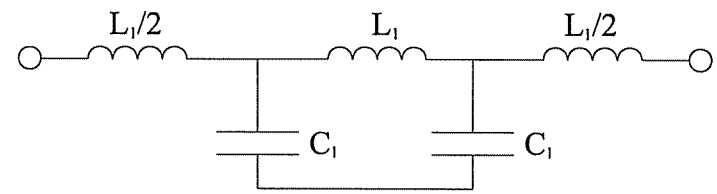
FIG. 3C illustrates a schematic diagram of the even mode equivalent circuit of the inductance-capacitance resonant structure of the common mode noise suppression circuit occurring parallel resonance in accordance with the present invention.

The following description will explain physical mechanism of resonant zero disclosed in equation (2) in corporation with FIG. 3B and FIG. 3C.

According to equation (2), it may realize that a first resonant zero is frequency when the inductance-capacitance resonant structure provides serial resonance. As illustrated in FIG. 3B, it shows that the inductance-capacitance resonant structure provides serial resonance at a first resonant zero frequency to form low impedance with respect to a common mode signal such that the common mode signal is guided to the ground structure.

Moreover, according to equation (2), it may realize that a second resonant zero is frequency when the inductance-capacitance resonant structure provides parallel resonance. As illustrated in FIG. 3C, it shows that the inductance-capacitance resonant structure provides parallel resonance at a second resonant zero frequency to form high impedance with respect to the common mode signal such that the common mode signal is reflected to the original route and thus failing to go on transmission.

It should be explained that although the common mode noise suppression circuit may be represented by equivalent circuit with higher degrees (for instance, three or five), adopting equivalent circuit having higher degrees with respect to common mode signal generates double-zero to suppress common mode signal within frequency scope considered in the present invention. Hence analyzing double-zero circuit with two degrees is quite representative in some level and may simplify analysis process.

Figure 4A:
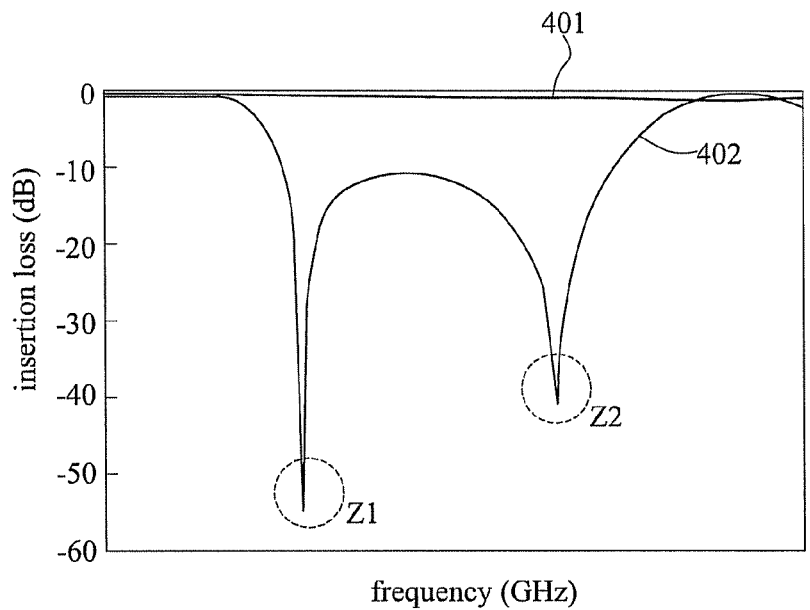
FIG. 4A illustrates a schematic diagram of two resonant zeros formed by the common mode noise suppression circuit in accordance with the present invention.

Please refer to FIG. 4A, which shows a schematic diagram of two resonant zeros $Z_1$, $Z_2$ formed by the common mode noise suppression circuit of the present invention. A curve 401 is transmission condition of a differential mode signal at each frequency. By this, the differential mode signal is transmitted normally in the common mode noise suppression circuit of the present invention, and it is not affected or suppressed. In contrast, a curve 402 is transmission condition of a common mode signal at each frequency and generates the previously described resonant zeros $Z_1$, $Z_2$ at specific frequency. It should be realized that the first resonant zero $Z_1$ and the second resonant zero $Z_2$ may be at the same or different frequency according to a dimension and a characteristic of each component of the common mode noise suppression circuit.

Figure 4B:
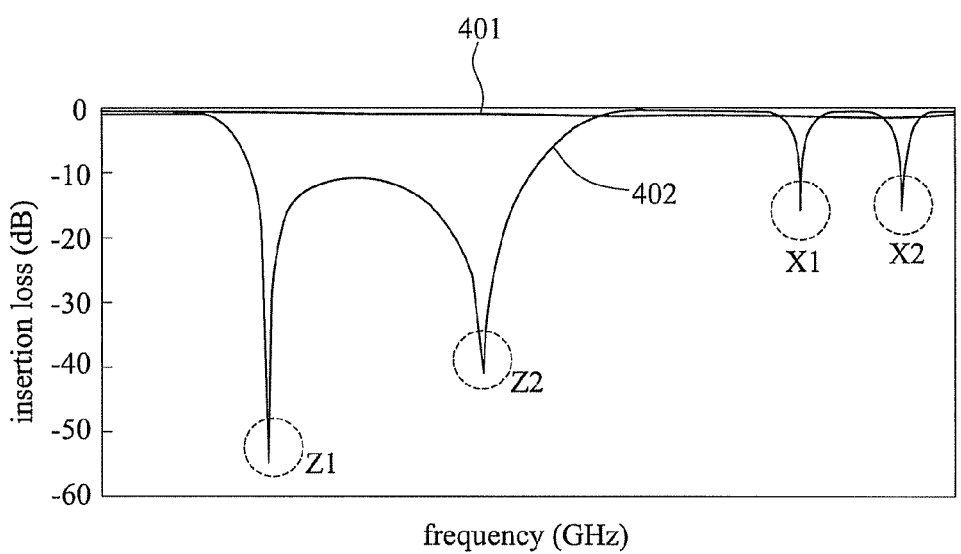
FIG. 4B illustrates a schematic diagram of extra zeros generated by a transmission line structure at a higher specific frequency formed by the common mode noise suppression circuit based on transmission line effect or electromagnetic coupling effect combining inductance effect of the ground structure in accordance with the present invention.

It should be explained that the transmission conductor having transmission line characteristic at high frequency is affected by electromagnetic coupling effect or transmission line effect combining inductance effect of the ground structure and then generates a phenomenon similar to a zero at a specific one or plural frequencies, wherein these phenomena similar to zero may result in the zero similar to desire of the present invention, however substantially physical theorem is not the same. As for details of electromagnetic coupling effect and transmission line effect are not described herein. FIG. 4B shows a schematic diagram of zeros $X_1$, $X_2$ generated by a transmission line structure at higher specific frequency formed by the common mode noise suppression circuit based on transmission line effect or electromagnetic coupling effect combining inductance effect of the ground structure in accordance with the present invention. Compared with FIG. 4A, FIG. 4B shows for instance two additional zeros at higher frequency based on characteristic of a transmission line or a transmission conductor while there may be more than two or any quantity of similar zeros. As previous description, this kind of phenomenon similar to zero results from electromagnetic coupling effect or transmission line effect of a transmission line structure. Hence, the two extra zeros $X_1$, $X_2$ are not the same with the resonant zeros $Z_1$, $Z_2$ disclosed in the present invention.

Figure 5A:
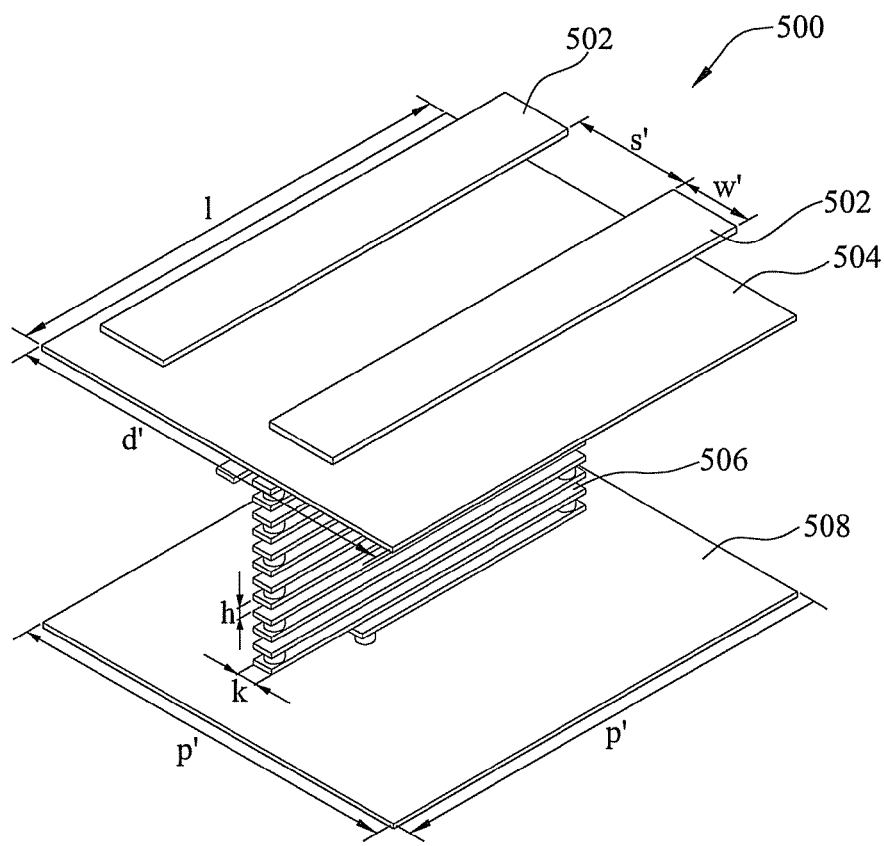
FIG. 5A illustrates a schematically stereo diagram of the common mode noise suppression circuit in accordance with another embodiment of the present invention.
Figure 5B:
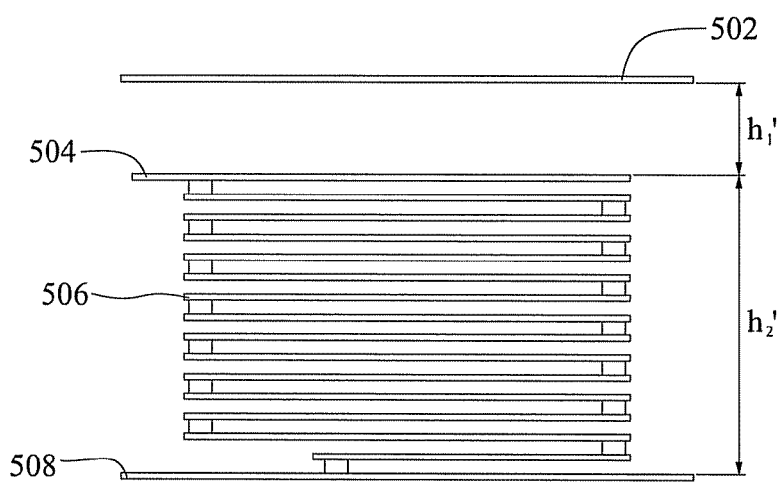
FIG. 5B illustrates a side view diagram of the common mode noise suppression circuit in accordance with another embodiment of the present invention.

Please refer to FIGS. 5A and 5B, wherein FIG. 5A is a schematically stereo diagram of a common mode noise suppression circuit 500 in accordance with another embodiment of the present invention, and FIG. 5B is a side view diagram of the common mode noise suppression circuit in accordance with another embodiment of the present invention. As illustrated, the common mode noise suppression circuit 500 substantially consists of a pair of transmission conductors 502, a reference potential structure 504, a ground structure 506 and a ground layer 508. The designer may design a line width w' and a distance s' of these transmission conductors 502 according to transmission impedance of the system. With respect to common mode noise suppression effect of the common mode noise suppression circuit 500, the designer may further regulate each layer height h and layer width k of the ground structure 506, width d' and length l of the reference potential structure 504, height $h_1'$ of the transmission conductors and the ground structure and overall height $h_2'$ of the ground structure. The common mode noise suppression circuit 500 may be representative of a lumped circuit model illustrated in FIG. 6 within considered frequency scope when unit length p' of the structure (length of the ground layer 508) is less than operating wavelength of a signal.

Figure 6:
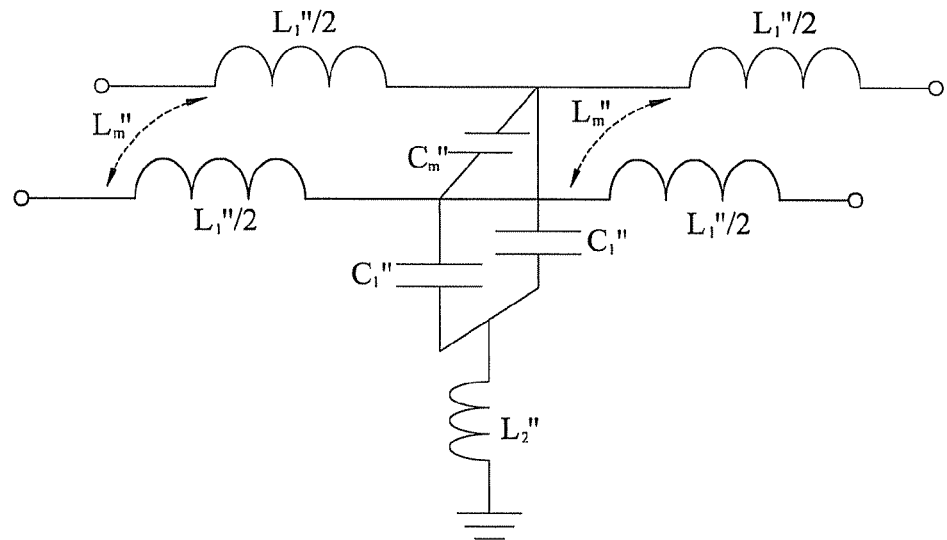
FIG. 6 illustrates an equivalent lumped circuit of the common mode noise suppression circuit having one degree shown in FIG. 5A.
Figure 7A:
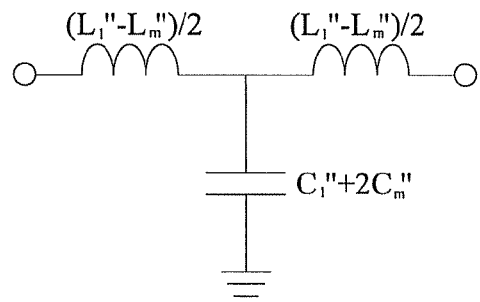
FIG. 7A illustrates an odd mode equivalent circuit of the equivalent lumped circuit shown in FIG. 6.
Figure 7B:
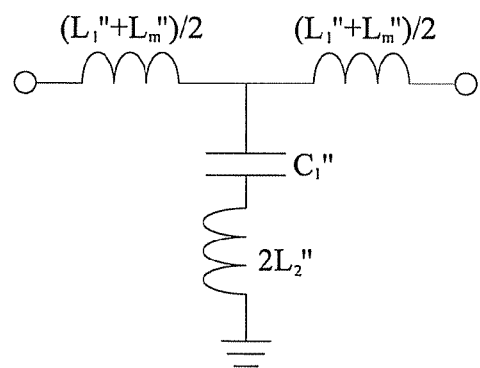
FIG. 7B illustrates an even mode equivalent circuit of the equivalent lumped circuit shown in FIG. 6.

A distributed equivalent circuit showed in FIG. 6 may be expressed as an odd and an even mode distributed equivalent circuits respectively shown in FIGS. 7A and 7B. In FIG. 7A, the odd mode equivalent circuit comprising a serial inductance and a parallel (bypass) capacitance forms a typical right-handed transmission line equivalent circuit. In the architecture of FIG. 7A, the differential mode signal may be transmitted well before achieving a cut-off frequency $\omega_c$ (as illustrated in equation (3)).

$$\omega_c \approx 1/\sqrt{(L_1''-L_m'')(C_1''+2C_n'')} \quad (3)$$

In FIG. 7B, the even mode equivalent circuit consists of serial LC resonators. Since the inductance-capacitance resonator generates serial resonance at a resonance frequency $\omega_c$, common mode noise closing to the resonance frequency $\omega_0$ may be suppressed.

$$\omega_0 = 1/\sqrt{2L_2''C_1''} \quad (4)$$

It may be understood easily via the previous embodiment that the designer may control desired scope of common mode noise suppression frequency by regulating or selecting appropriate inductance $L_2''$.

Figure 8:
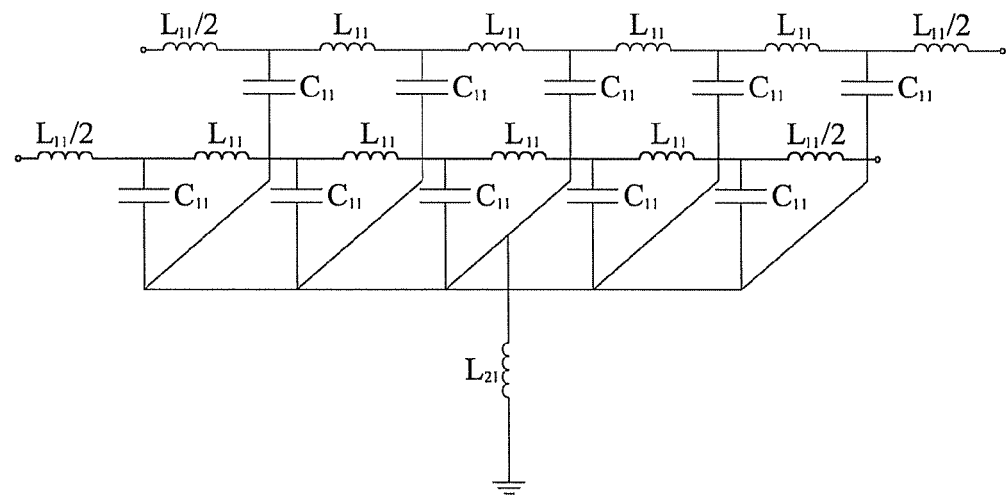
FIG. 8 illustrates an equivalent lumped circuit of the common mode noise suppression circuit having five degrees in accordance with the present invention.
Figure 9A:
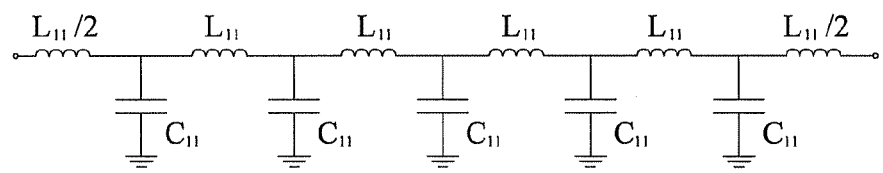
FIG. 9A illustrates an odd mode equivalent circuit of the equivalent lumped circuit shown in FIG. 8.
Figure 9B:
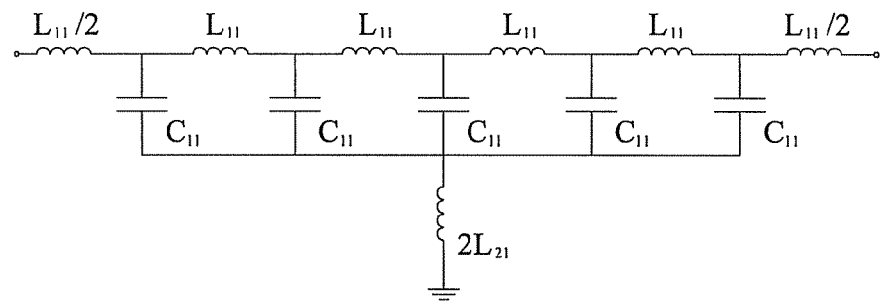
FIG. 9B illustrates an even mode equivalent circuit of the equivalent lumped circuit shown in FIG. 8.

In the common mode noise suppression circuit of the present invention, each transmission conductor and the reference potential structure may be approximated to be an uniform transmission line and it expresses electromagnetic coupling effect of each transmission conductor and the reference potential structure in the common mode noise suppression circuit as a ladder network form based on plural sections of transmission line model (T-model) (for instance, represented by five T-models consisting of inductance $L_{11}$ and capacitance $C_{11}$). FIG. 8 illustrates an equivalent lumped circuit having five degrees of the common mode noise suppression circuit of the present invention. For the differential mode signal, the equivalent circuit shown in FIG. 8 may further be expressed as the odd mode equivalent circuit shown in FIG. 9A. As illustrated in FIG. 9A, with respect to the differential mode signal, transmission line structure consisting of inductance $L_{11}$ and capacitance $C_{11}$ supplies transmission characteristic of low attenuation and low loss for the differential mode signal such that the differential mode signal transmission is not affected. FIG. 9B illustrates the even mode equivalent circuit of the equivalent lumped circuit shown in FIG. 8. With respect to the common mode signal, the resonator structure consisting of inductance $L_{11}$, $L_{21}$ and capacitance $C_H$ generates serial resonance at a first specific frequency and then forms low impedance with related to the common mode signal such that the common mode signal is guided to the ground potential and thus forming a first zero. Besides, the resonator structure generates parallel resonance at a second specific frequency and then forms high impedance with related to the common mode signal such that the common mode signal is reflected to the original route and thus failing to be transmitted to form a second zero. Hence, the equivalent lumped circuit shown in FIG. 8 suppresses the common mode signal while keeping unaffected transmission of the differential mode signal. It should be appreciated that the first specific frequency and the second specific frequency may be the same or not.

Figure 10:
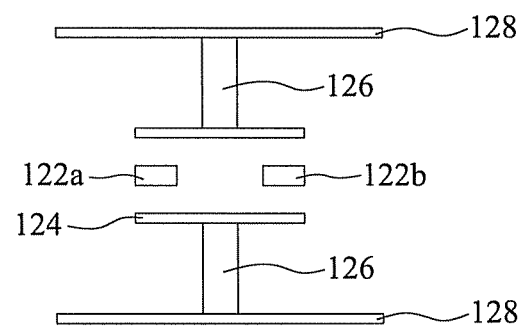
FIG. 10 illustrates a cross-sectional view of the common mode noise suppression circuit in accordance with another embodiment of the present invention.

Please refer to FIG. 10, it illustrates a cross-sectional view of the common mode noise suppression circuit in accordance with another embodiment of the present invention. As illustrated, there are symmetric reference potential structures 124 disposed on two sides of the transmission conductors 122a, 122b, wherein the reference potential structures are respectively electrically connected to the ground layer 128 via the ground structure 126. By this, the common mode noise suppression circuit of the present invention may be modified and combined based on structures shown in FIG. 2. It may combines plural unit length structures in varies relative locations according a designer's demand to provide desired common mode noise suppression effect.

Figure 11:
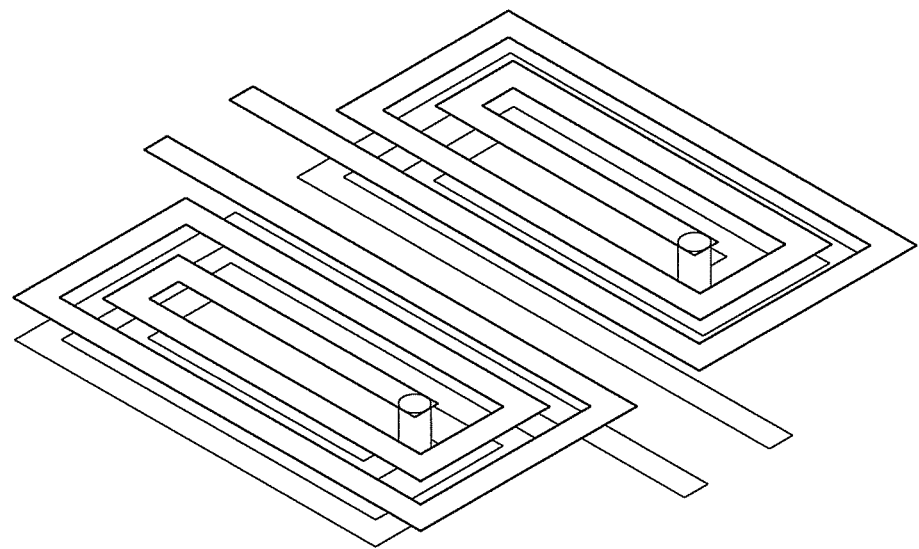
FIG. 11 illustrates a differential transmission structure of the common mode noise suppression circuit in accordance with another embodiment of the present invention.
Figure 12:
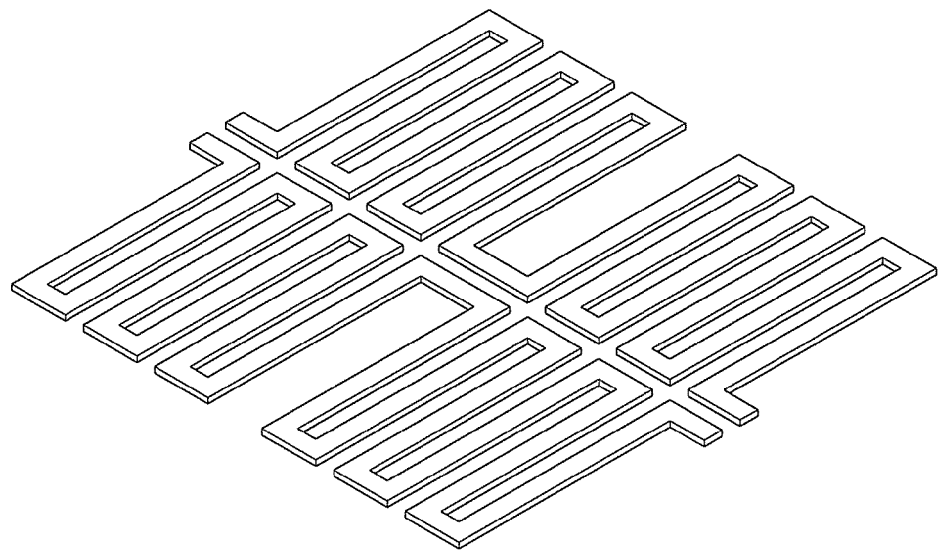
FIG. 12 illustrates a differential transmission structure of the common mode noise suppression circuit in accordance with further embodiment of the present invention.
Figure 13:
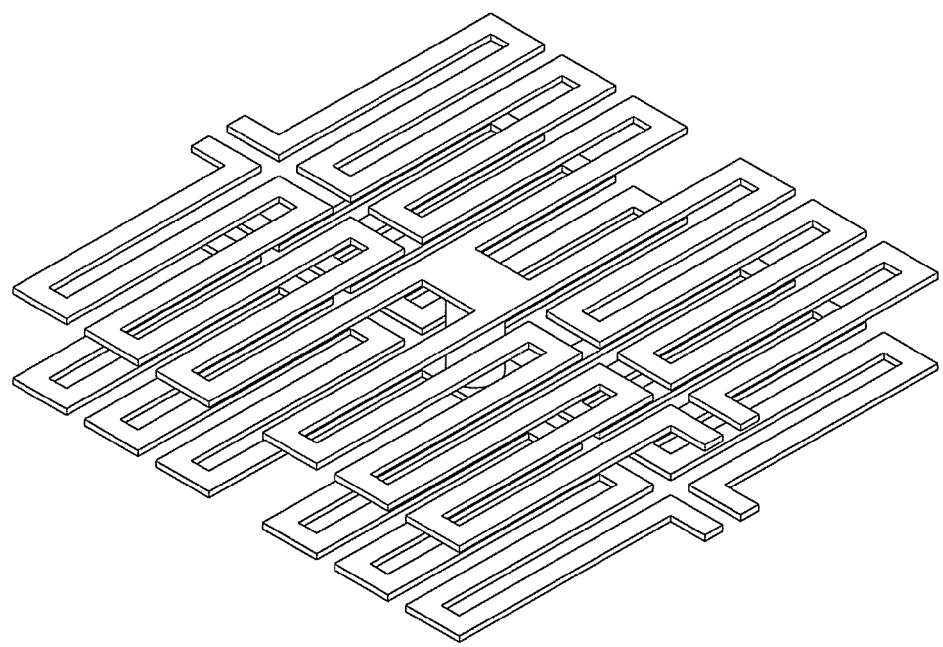
FIG. 13 illustrates a reference potential structure of the common mode noise suppression circuit in accordance with another embodiment of the present invention.
Figure 14:
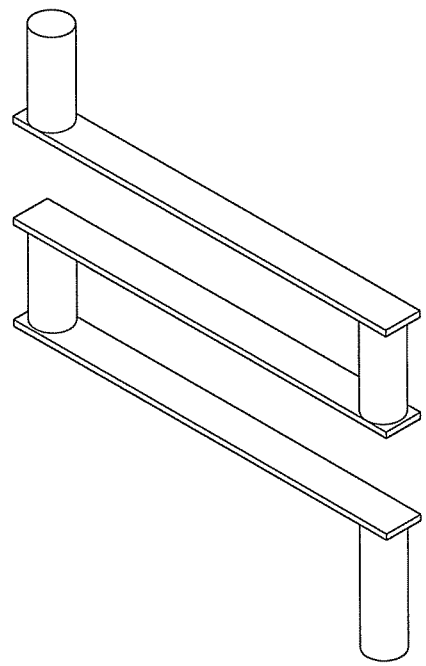
FIG. 14 illustrates a ground structure of the common mode noise suppression circuit in accordance with another embodiment of the present invention.
Figure 15:
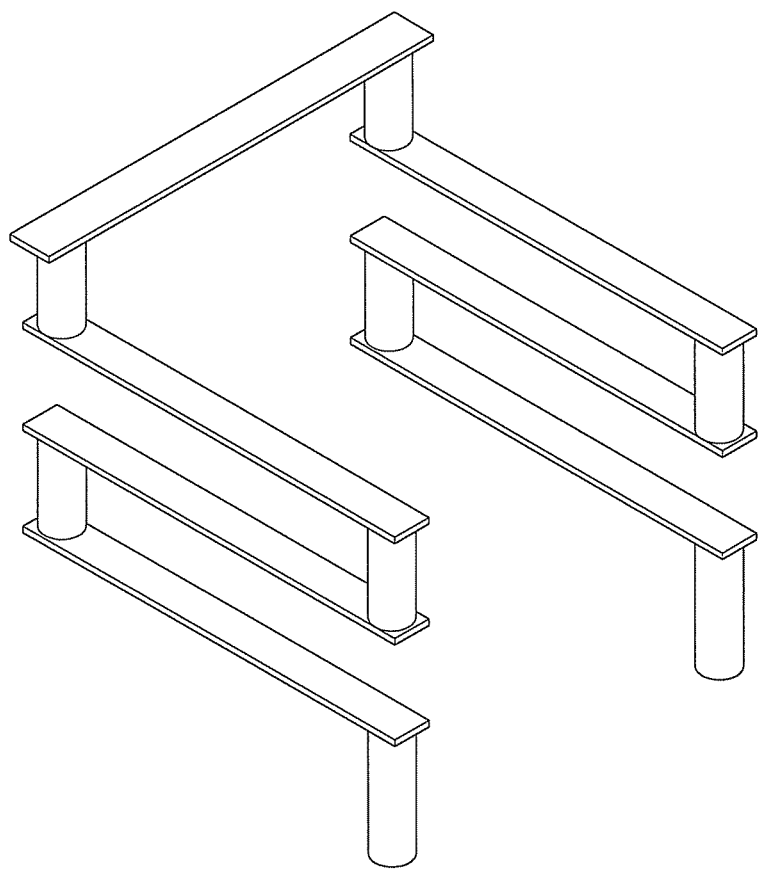
FIG. 15 illustrates a ground structure of the common mode noise suppression circuit in accordance with further embodiment of the present invention.

It should be explained that each component of the common mode noise suppression circuit of the present invention is not restricted to shape or dimension disclose in the previous embodiment. FIGS. 11 and 12 illustrate a possible embodiment of a differential transmission structure. Additionally, FIG. 13 illustrates a possible embodiment of a reference potential structure. Furthermore, FIGS. 14 and 15 illustrate a possible embodiment of a ground structure.

Known by above content, the common mode noise suppression circuit of the present invention suppresses high frequency common mode noise without affecting quality of differential signals meanwhile it may prove miniaturization of a common mode noise filter circuit and my be realized on a circuit board so as to provide a common mode noise suppression solution having performance superiority and cost benefit thereby preventing problems of too low operating frequency and too high cost or too complex manufacturing process in prior arts.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A common mode noise suppression circuit applicable to suppress a common mode noise when transmitting a differential signal, comprising:
   a reference potential structure formed from a conductor;
   a differential transmission structure disposed to form an electromagnetic coupling with the reference potential structure, wherein the differential transmission structure has two transmission conductors for transmitting the differential signal, and the two transmission conductors respectively form the electromagnetic coupling with the reference potential structure so as to form a transmission line characteristic to prevent differential mode transmission from being affected when transmitting the differential signal;

a ground layer electrically connected to a ground potential; and a ground structure electrically connected to the reference potential structure and the ground layer for forming an inductance-capacitance resonant structure together with the electromagnetic coupling formed by the reference potential structure and the differential transmission structure, and an inductance formed by the ground structure itself, so as to suppress a common mode signal at a specific frequency, wherein the two transmission conductors are coplanar, and are disposed to be parallel or symmetric to each other, and wherein a dielectric material or a ferromagnetic/ferrimagnetic material layer is further disposed between the reference potential structure and the differential transmission structure.

2. The common mode noise suppression circuit of claim 1, wherein a coupling capacitance and a coupling inductance are respectively formed between the reference potential structure and the two transmission conductors, and the inductance formed by the ground structure is formed between the reference potential structure and the ground layer.

3. The common mode noise suppression circuit of claim 1, wherein the inductance-capacitance resonant structure provides a serial resonance at a first specific frequency and forms a low impedance with respect to the common mode signal, such that the common mode signal is guided to the ground potential to form a first zero at the first specific frequency.

4. The common mode noise suppression circuit of claim 1, wherein the inductance-capacitance resonant structure provides a parallel resonance at a second specific frequency and forms a high impedance with respect to the common mode signal such that the common mode signal is guided to an original route and prevented from being transmitted, and forms a second zero at the second specific frequency.

5. The common mode noise suppression circuit of claim 1, wherein the electromagnetic coupling or transmission line characteristic formed by the two transmission conductors and the reference potential structure combines with the ground structure to form an inductance characteristic, such that the common mode noise suppression circuit forms corresponding zeros at one or more specific frequencies.

6. The common mode noise suppression circuit of claim 1, wherein the transmission line characteristic formed by the two transmission conductors and the reference potential structure prevents attenuation and loss of the differential signal when transmitting the differential signal, thereby assuring the transmission of the differential signal.

7. The common mode noise suppression circuit of claim 1, wherein the ground structure is electrically connected to the reference potential structure at a midline location of the two transmission conductors.

8. The common mode noise suppression circuit of claim 1, wherein a main body of the reference potential structure has an arc-shaped surface.

9. The common mode noise suppression circuit of claim 1, wherein a main body of the reference potential structure has an irregular surface.

10. A common mode noise suppression circuit applicable to suppress a common mode noise when transmitting a differential signal, comprising:

a reference potential structure formed from a conductor;

a differential transmission structure forming an electromagnetic coupling with the reference potential structure, wherein the differential transmission structure has two transmission conductors for transmitting the differential signal, and the two transmission conductors respectively form the electromagnetic coupling with the reference potential structure to form a transmission line characteristic when transmitting the differential signal;

a ground layer electrically connected to a ground potential; and a ground structure electrically connected to the reference potential structure and the ground layer for forming an inductance-capacitance resonant structure together with the electromagnetic coupling formed by the reference potential structure and the differential transmission structure, and an inductance formed by the ground structure itself, wherein the inductance-capacitance resonant structure provides a serial resonance at a first specific frequency and forms a low impedance with respect to a common mode signal such that the common mode signal is guided to the ground potential to form a first zero at the first specific frequency, the inductance-capacitance resonant structure provides a parallel resonance at a second specific frequency and forms a high impedance with respect to the common mode signal such that the common mode signal is guided to an original route and prevented from being transmitted, and forms a second zero at the second specific frequency, and the two transmission conductors are coplanar, and are disposed to be parallel or symmetric to each other.

11. The common mode noise suppression circuit of claim 10, wherein a coupling capacitance and a coupling inductance are respectively formed between the reference potential structure and the two transmission conductors, and the inductance formed by the ground structure is formed between the reference potential structure and the ground layer.

12. The common mode noise suppression circuit of claim 10, wherein the electromagnetic coupling or transmission line characteristic formed by the two transmission conductors and the reference potential structure combines with the ground structure to form an inductance characteristic, such that the common mode noise suppression circuit forms corresponding zeros at one or more specific frequencies.

13. The common mode noise suppression circuit of claim 10, wherein the transmission line characteristic formed by the two transmission conductors and the reference potential structure prevents attenuation and loss of the differential signal when transmitting the differential signal, thereby assuring the transmission of the differential signal.

14. The common mode noise suppression circuit of claim 10, wherein the ground structure is electrically connected to the reference potential structure at a midline location of the two transmission conductors.

15. The common mode noise suppression circuit of claim 10, wherein a main body of the reference potential structure has an arc-shaped surface.

16. The common mode noise suppression circuit of claim 10, wherein a main body of the reference potential structure has an irregular surface.

17. The common mode noise suppression circuit of claim 10, wherein a dielectric material or a ferromagnetic/ferrimagnetic material layer is further disposed between the reference potential structure and the differential transmission structure.

* * * * *